(12) United States Patent
Nagashima et al.

(10) Patent No.: US 11,961,701 B2
(45) Date of Patent: Apr. 16, 2024

(54) CHARGED PARTICLE BEAM DEVICE AND OPERATION METHOD THEREFOR

(71) Applicant: Hitachi High-Tech Corporation, Tokyo (JP)

(72) Inventors: Tomoharu Nagashima, Tokyo (JP); Kazuki Ikeda, Tokyo (JP); Wen Li, Tokyo (JP); Masashi Wada, Tokyo (JP); Hajime Kawano, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 353 days.

(21) Appl. No.: 17/603,225

(22) PCT Filed: Apr. 24, 2019

(86) PCT No.: PCT/JP2019/017496
§ 371 (c)(1),
(2) Date: Oct. 12, 2021

(87) PCT Pub. No.: WO2020/217354
PCT Pub. Date: Oct. 29, 2020

(65) Prior Publication Data
US 2022/0189729 A1    Jun. 16, 2022

(51) Int. Cl.
*H01J 37/22* (2006.01)
*G06F 3/04847* (2022.01)
*H01J 37/28* (2006.01)

(52) U.S. Cl.
CPC ........ *H01J 37/222* (2013.01); *G06F 3/04847* (2013.01); *H01J 37/28* (2013.01); *H01J 2237/2448* (2013.01)

(58) Field of Classification Search
CPC ........ H01J 37/222; H01J 37/28; H01J 37/265; H01J 2237/2448; G06F 3/0482; G06F 3/04847
(Continued)

(56) References Cited

U.S. PATENT DOCUMENTS

| | | | |
|---|---|---|---|
| 2002/0130262 A1* | 9/2002 | Nakasuji | G01N 23/225 250/311 |
| 2002/0148975 A1* | 10/2002 | Kimba | H01J 37/073 250/492.1 |

(Continued)

FOREIGN PATENT DOCUMENTS

| | | |
|---|---|---|
| JP | 2006-190554 A | 7/2006 |
| JP | 2010-033723 | 2/2010 |

(Continued)

OTHER PUBLICATIONS

International Search Report, PCT/JP2019/017496, dated Jul. 16, 2019, 2 pgs.
(Continued)

*Primary Examiner* — Kiet T Nguyen
(74) *Attorney, Agent, or Firm* — Volpe Koenig (57) ABSTRACT

When adjusting optical axes of a multi-beam charged particle beam device, because parameters of optical systems are inter-dependent, the time required to adjust the parameters increases. Thus, the present invention provides a charged particle beam device provided with an optical parameter setting unit for setting parameters of optical systems for emitting a plurality of primary charged particle beams to a sample, detectors for individually detecting a plurality of secondary charged particle beams discharged from the sample, a plurality of memories for storing signals detected by the detectors and converted into digital pixels in the form of images, evaluation value derivation units for deriving evaluation values of the primary charged particle beams from the images, and a GUI capable of displaying the images and receiving an input from a user, wherein the GUI displays the images and evaluation results based on the evaluation values and changes various optical parameters in real-time.

13 Claims, 9 Drawing Sheets

(58) Field of Classification Search
USPC .................................................. 250/306, 307
See application file for complete search history.

(56) References Cited

U.S. PATENT DOCUMENTS

2012/0326033 A1  12/2012  Shiono et al.
2021/0125806 A1   4/2021  Hamada et al.

FOREIGN PATENT DOCUMENTS

| JP | 2011-187192 A | 9/2011 |
| JP | 2013-025946 A | 2/2013 |
| JP | 2014-026834 A | 2/2014 |
| TW | 201911360 A | 3/2019 |
| WO | 2013/011792 A1 | 1/2013 |
| WO | 2019/021536 A1 | 1/2019 |

OTHER PUBLICATIONS

International Preliminary Report on Patentability, PCT/JP2019/017496, 4 pgs. dated Sep. 18, 2020.
Taiwan Office Action, Taiwan Application No. 109106488, dated Jan. 27, 2021, 6 pgs.

\* cited by examiner

CHARGED PARTICLE BEAM DEVICE AND OPERATION METHOD THEREFOR

TECHNICAL FIELD

The present invention relates to a charged particle beam device including a plurality of detectors and an operation method therefor.

BACKGROUND ART

As a background art of a charged particle beam device provided with a plurality of detectors, for example, JP-A-2006-190554 (PTL 1) is provided. This publication discloses that in an electron microscope provided with a plurality of secondary electron detectors or backscattered electron detectors, in order to be able to control contrast/brightness of the plurality of detectors with one single control operation, a coefficient of contrast variable amount is set for each detector by using a signal amount ratio between each detector that changes as an observation condition such as an operation distance changes. For example, relation between the operation distance and the coefficient of contrast variable amount is obtained; with respect to the operation distance read from an observation condition memory, the coefficient of the contrast variable amount is calculated individually for an upper detector and a lower detector by a coefficient calculation unit; and with respect to one control operation by a contrast/brightness operation unit, an amount of change in contrast for each detector is individually given via a detector control unit.

CITATION LIST

Patent Literature

PTL 1: JP-A-2006-190554

SUMMARY OF INVENTION

Technical Problem

PTL 1 discloses an image adjustment method in which contrast/brightness of an image obtained by the plurality of detectors can be adjusted in one single control operation in the electron microscope provided with the plurality of detectors. However, in the method of PTL 1, images obtained by the detectors are added and displayed, and parameters are adjusted by a user; therefore, the adjustment may be complicated and the time it takes to adjust the parameters may be increased in a case where the parameters are dependent on each other. For example, in a multi-beam charged particle beam device, optical axes of a plurality of primary electron beams are adjusted by voltages of an aperture array, that is, aperture voltages, but an electric field state changes when the aperture voltage for a certain beam is changed, which affects other beams. When such parameters are dependent on each other, it is considered to be difficult to adjust the parameters in one image display, and the usability deteriorates.

An object of the present invention is to solve the above-mentioned problem, and to provide a charged particle beam device and an operation method therefor in which parameters of a plurality of image displays corresponding to the number of a plurality of detectors are adjusted without discarding an image.

Solution to Problem

In order to achieve the above object, the present invention provides a charged particle beam device including an optical system configured to irradiate a sample with a plurality of primary charged particle beams; an optical parameter setting unit configured to set a parameter of the optical system; a detector configured to individually detect a plurality of secondary charged particle beams emitted from the sample; a plurality of storage units each configured to store a signal, that is detected by the detector and converted into a digital pixel, in a form of an image; an evaluation value derivation unit configured to derive an evaluation value of the primary charged particle beam from the image; and a GUI configured to display an image and receive an input from a user, wherein the GUI displays the image and an evaluation result based on the evaluation value.

In addition, in order to achieve the above object, the present invention provides an operation method of a charged particle beam device including a GUI configured to display an image and receive an input from a user, and the operation method includes setting parameters for an optical system configured to irradiate a sample with a plurality of primary charged particle beams; individually detecting a plurality of secondary charged particle beams emitted from the sample; converting a detected signal into a digital pixel and storing the digital pixel as an image; deriving an evaluation value of the primary charged particle beam from the image; and displaying the image and an evaluation result based on the evaluation value on the GUI.

Advantageous Effect

According to the present invention, when the parameters of the charged particle beam device including a plurality of detectors are adjusted, the adjustment efficiency can be improved by enabling the adjustment while taking an overhead view of the whole.

DESCRIPTION OF EMBODIMENTS

Hereinafter, various embodiments of the present invention will be sequentially described with reference to the drawings. In addition, in the following embodiments, an electron beam will be described as an example of a charged particle beam, but is not limited to the electron beam, and the invention can also be applied to other charged particle beams.

Embodiment 1

In Embodiment 1, a charged particle beam device in which optical axes of a plurality of primary electron beams are adjusted by a user performing parameter manual adjustment will be described.

Figure 1:
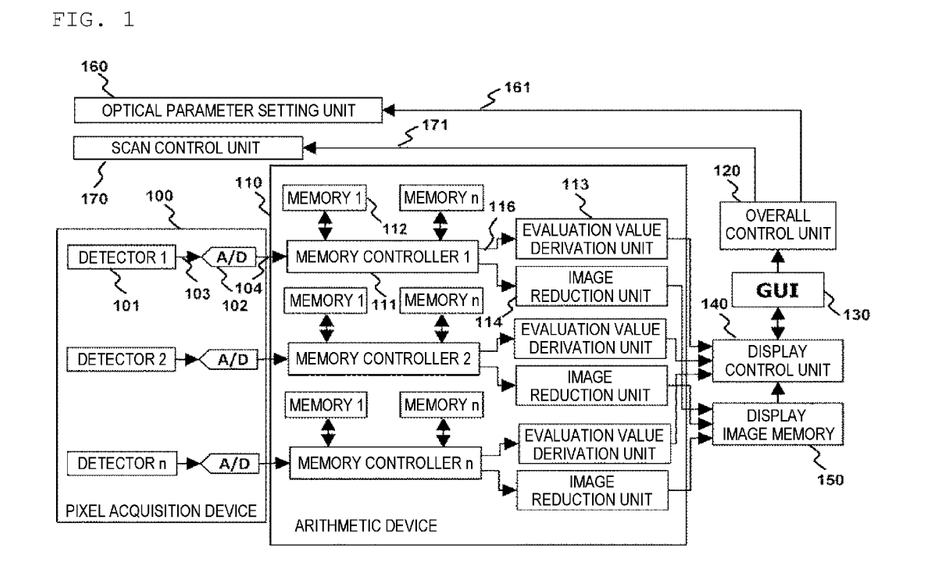
FIG. 1 is a schematic diagram of a configuration of a charged particle beam device of Embodiment 1.

FIG. 1 is a schematic diagram showing a configuration of a charged particle beam device of Embodiment 1. The charged particle beam device includes a pixel acquisition device 100 including a plurality of detectors 101 and a plurality of A/D converters 102; an arithmetic device 110 including memory controllers 111, a plurality of memories 112 that store acquired images, evaluation value derivation units 113 into which images read from the memories 112 are input, and image reduction units 114; an overall control unit 120; a Graphical User Interface (GUI) 130 including a display; a display control unit 140; a display image memory 150; an optical parameter setting unit 160 that sets parameters of optical systems; a scan control unit 170; and a column which is not shown. In addition, the A/D converters 102, the memory controllers 111, the plurality of memories 112, the evaluation value derivation units 113, and the image reduction units 114 include systems (hereafter, referred to as channels) of the number (n) of the detectors 101, and the systems operate in parallel. The overall control unit 120 sets information received from the GUI 130 into the optical parameter setting unit 160, and sets scan information into the scan control unit 170.

In FIG. 1, the pixel acquisition device 100, the optical parameter setting unit 160 and the scan control unit 170 each are configured with dedicated hardware. The arithmetic device 110, the overall control unit 120, the GUI 130, the display control unit 140, and the display image memory 150 may be configured with a central processing unit (CPU) of a Personal Computer (PC) provided with a display, a storage unit represented by a storage device such as a memory or a Solid State Drive (SSD), a display controller, and the like. For example, the evaluation value derivation unit 113 and the image reduction unit 114 can be realized by function programs executed by the CPU.

Figure 2A:
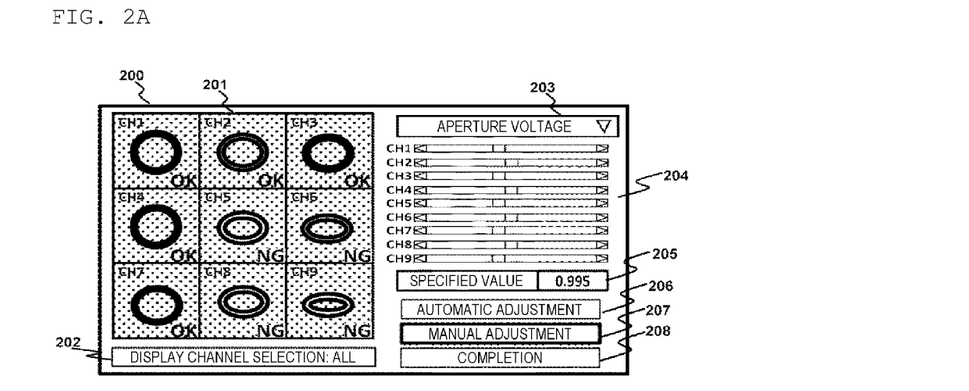
FIG. 2A is a diagram showing an example of a GUI screen display of Embodiment 1.
Figure 2B:
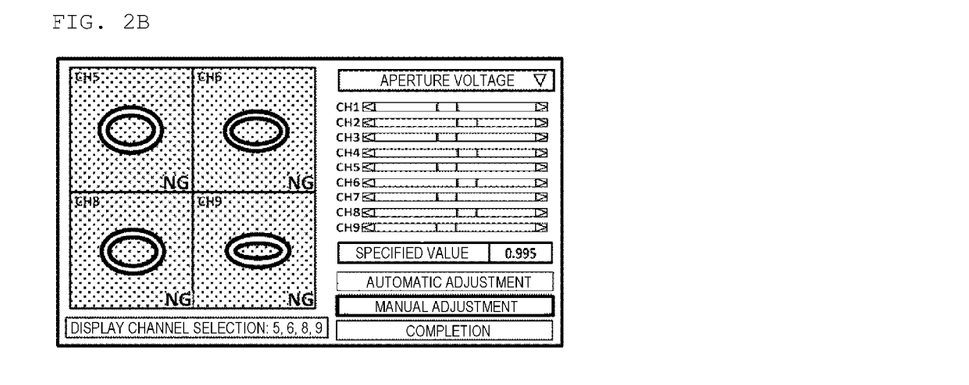
FIG. 2B is a diagram showing another example of the GUI screen display of Embodiment 1.

FIGS. 2A and 2B show display examples of a GUI screen of the charged particle beam device of the present embodiment. FIG. 2A shows an example in which nine channels of images are all displayed, and FIG. 2B shows another example in which four channels including channels 5, 6, 8, and 9 are selected and displayed.

A GUI screen 200 includes an image display unit 201 for displaying images obtained by the detectors 101 and evaluation results of a primary electron beam corresponding to the respective detectors, a display selection input unit 202 for selecting an image to be displayed, a parameter selection unit 203 for selecting parameters to be set, a slider input unit 204 for changing parameters, a specified value input unit 205 for an evaluation value of each beam, an automatic adjustment button 206 for selecting an automatic adjustment, a manual adjustment button 207 for selecting a manual adjustment, and a completion button 208 for inputting completion of an adjustment.

That is, the GUI 130 includes the display selection input unit 202 for selecting an image to be displayed, and the image display unit 201 for displaying a predetermined number of images selected by a user and the corresponding evaluation results adjacently. As a result, the user can perform an adjustment while taking an overhead view of the whole or a part of the whole, and thus the adjustment efficiency can be improved. In addition, the GUI 130 includes the parameter selection unit 203 for selecting a parameter, the slider input unit 204 capable of changing a parameter in real time, and the specified value input unit 205 for inputting a specified value of an evaluation value. As a result, the parameter adjustment time can be shortened.

Figure 3:
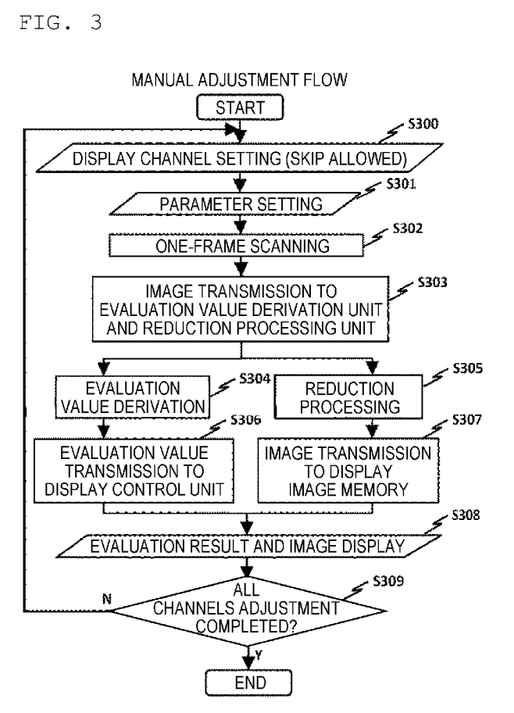
FIG. 3 is a diagram showing an operation flow at the time of parameter manual adjustment of Embodiment 1.

Hereinafter, a series of parameter adjustment flows will be described using an example of a manual adjustment flow of the present embodiment shown in FIG. 3. First, after pressing the manual adjustment button 207, the user selects the channel to be displayed (step 300, hereinafter, S300). Since an image change may be confirmed by continuously changing the parameters, S300 can be skipped. Subsequently, parameter setting is performed by changing the aperture voltage corresponding to each channel, which is an adjustment parameter, by the slider input unit 204 (S301). When the slide input is completed, optical parameter information 161 and scan information 171 such as a scanning method is transmitted from the overall control unit 120 to the optical parameter setting unit 160 and the scan control unit 170, respectively, and one-frame scanning of the primary electron beams is performed by the scan control unit 170 (S302). Along with the scanning, the primary electron beams are incident on a sample for optical axis adjustment in the column which is not shown, and the emitted secondary electron beams are input to the detectors 101. An analog signal 103 output from the detector 101 is converted into a digital pixel value 104 by the A/D converter 102 and stored in the memories 112 as image information 115 via the memory controller 111.

The acquired image information 115 is image-transmitted as image information 116 to the evaluation value derivation unit 113 and the image reduction unit 114 of the arithmetic device 110 (S303), and evaluation value derivation (S304) and reduction processing (S305) are performed in parallel. A derived evaluation value 117 is transmitted to the display control unit 140 (S306), a reduced image 118 is transmitted to the display image memory 150 (S307), an evaluation result and image of the channel selected by the user through the display control unit 140 is displayed on the GUI screen 200 (S308). Based on this result, the user determines whether to continue the parameter adjustment (S309), and if the parameter adjustment is to be continued, returns to (S300). Although not shown, (S303) to (S308) are performed for the number of channels.

Here, an evaluation value derivation method includes a method of using a roundness of an acquired image as the evaluation value and a method of using a normalized cross-correlation value of the acquired image and the golden pattern as the evaluation value, and does not limit the evaluation method. In addition, the image reduction unit 114 has a function of changing an image reduction ratio based on the number of selected channels. For example, it is assumed that the image display unit 201 can display an image size of up to 512×512, in a case where an image of 512×512 is acquired for each channel, when all nine channels are selected as shown in FIG. 2A, each image is reduced to ⅓ (a size of 170×170) in vertical and horizontal directions and transmitted to the display image memory 150. In addition, when four channels are selected as shown in FIG. 2B, only images in the selected channels are reduced by half (a size of 256×256) in the vertical and horizontal directions and transmitted to the display image memory 150. In either case, a plurality of images can be viewed in an overhead view.

According to the present embodiment, even when parameters are dependent on each other in such as the optical axis adjustment of the primary electron beams, the parameters can be adjusted while taking an overhead view of all beam states of the nine channels and further grasping details of the beam states when a certain channel is selected, and the dependency can be easily checked. As a result, the adjustment efficiency is improved and the parameter adjustment time can be shortened. In addition, in the present embodiment, nine channels in total are used, but if the number of beams increases and the number of channels also increases to, for example, 36, 64, or the like, the configuration of the present embodiment functions more efficiently. In addition, since the automatic adjustment button 206 and the manual adjustment button 207 are disposed on the GUI screen 200, the working efficiency of the user can be improved.

According to Embodiment 1 described above, in an adjustment of parameters which are dependent on each other such as the aperture voltage of, for example, a multi-beam charged particle beam device including a plurality of detectors, the adjustment efficiency can be improved by enabling adjustment while taking an overhead view of the whole. Further, the scanning, the evaluation value derivation, and the image display can be performed in parallel while preventing the scanned pixels from being discarded due to overwriting, and the parameter adjustment time can be shortened.

Embodiment 2

In Embodiment 2, an embodiment of a charged particle beam device that adjusts optical axes of a plurality of primary electron beams by pressing the automatic adjustment button 206 instead of a user manually adjusting the parameters will be described. Hereinafter, the automatic adjustment will be described as an adjustment method in which all parameters are assigned within value ranges and step sizes of parameters set in advance, and a parameter with a high evaluation value is adopted. For example, when a value range of each aperture voltage is set to −100 V to +100 V and the step size is set to 2 V, 100 parameters are assigned to one beam. However, the present embodiment is not limited to the above adjustment method.

Figure 4:
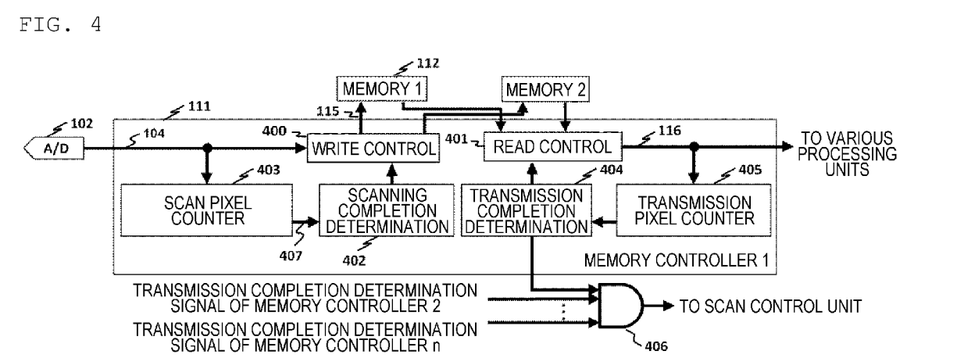
FIG. 4 is a detailed configuration diagram of a memory controller of Embodiment 2.

FIG. 4 shows an example of a detailed configuration of the memory controller 111 of FIG. 1. The digital pixel value 104 output from the A/D converter 102 is written to the memory 112 as the image information 115 via a write control 400. In addition, at the time of image transmission, the image information 116 is transmitted from the memory 112 to various processing units such as the evaluation value derivation unit 113 via a read control 401.

The memory controller 111 includes a scan pixel counter 403 that counts digital pixels and a transmission pixel counter 405 that counts the number of transmission pixels during image transmission, performs a write control so as to switch a memory that stores an image when scanning completion is determined based on the number of scan pixels output from the scan pixel counter 403 and a preset image size, and performs a read control so as to switch a memory that reads an image when transmission completion is determined based on the number of transmission pixels output from the transmission pixel counter 405 and a preset image size.

Figure 5:
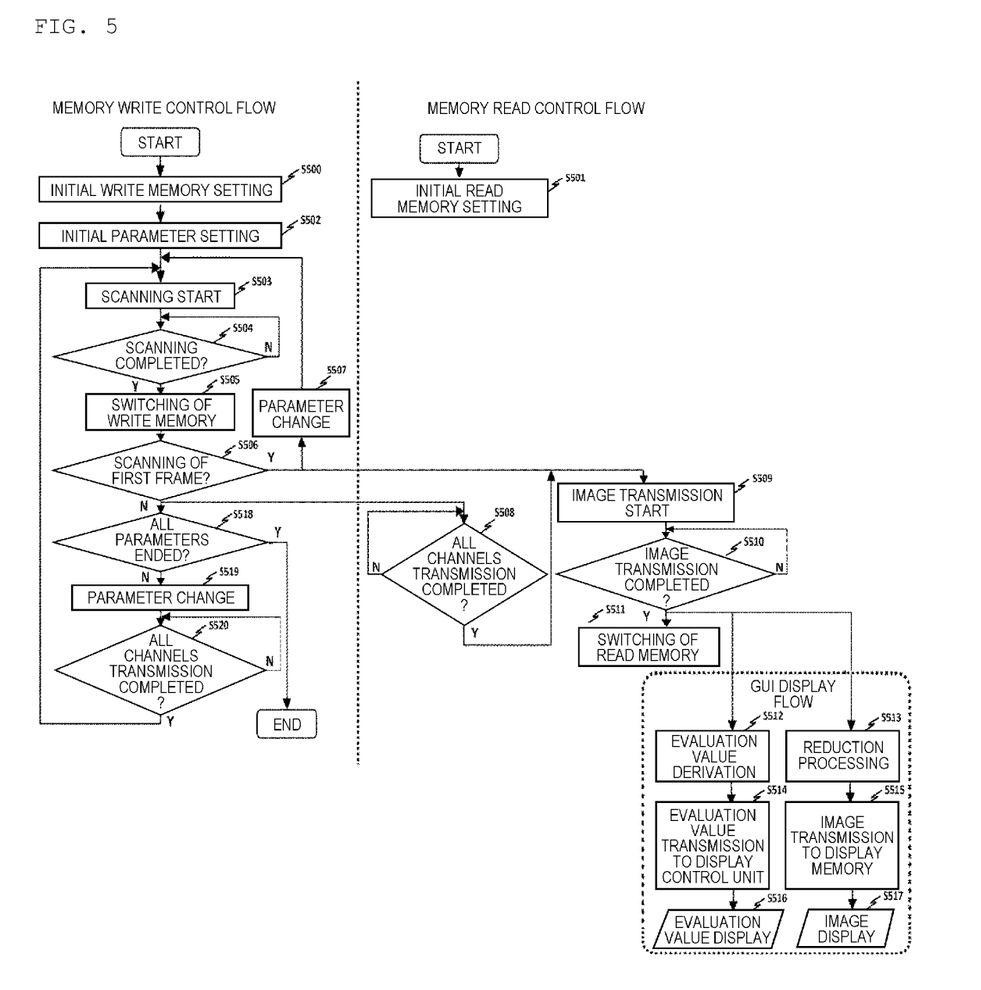
FIG. 5 is a diagram showing an operation flow of the memory controller of Embodiment 2 at the time of parameter automatic adjustment.

Hereinafter, a control method of executing scanning and image transmission in parallel while preventing the scanned pixels from being discarded due to overwriting will be described with reference to an example of an operation flow of the memory controller of the present embodiment shown in FIG. 5. First, a memory 112 (hereafter, referred to as write memory) that writes an image obtained by scanning of a first frame and a memory 112 (hereafter, referred to as read memory) that reads (transmits) the same image are set (S500 and S501), and initial values of optical parameters are set (S502). Scanning is started (S503) when the parameter setting is completed, and the memory controller waits until the scanning is completed (S504). Here, scanning completion determination 402 is performed by comparing the number of scan pixels 407 counted by the scan pixel counter 403 in the memory controller with the preset image size (the number of pixels). When the number of scan pixels 407 is equal to the image size, the scanning is completed.

The write memory is switched when the scanning is completed (S505), whether the scanning is scanning of the first frame is determined (506), parameters are changed if the scanning is the scanning of the first frame (S507), a next optical parameter is immediately set in the optical parameter setting unit 160, and scanning (of second and subsequent frames) is performed. In addition, if the scanning is the first scanning, image transmission is started when the scanning is completed (S509), and if the scanning is scanning of the second and subsequent frames, the memory controller waits until the image transmission of all channels is completed (S508) and the transmission is started. Transmission completion determination 404 is performed by comparing the number of transmission pixels 408 counted by the transmission pixel counter 405 with a preset image size which is not shown. When the number of transmission pixels 408 is the same number as the image size, the transmission is completed (here, a transmission completion signal 409="1"). When the transmission is completed (S510), the read memory is switched (S511), and as in Embodiment 1, the flow of evaluation value derivation and image reduction processing is performed and displayed on the GUI screen 200 (S512) to (S517).

Here, although not shown, S509 to S517 are performed in parallel for the number of channels. After evaluations for the second and subsequent frames and for all parameters are completed, the adjustment is completed (S518). If the adjustment is to be continued, the following parameters are set (S519), the memory controller waits for the completion of image transmission of all channels (S520), and the next scanning is performed at a time point when the transmission is completed (S503). In the transmission completion determination for all channels, completion is determined when a logical sum 406 of transmission completion signals 410 of all memory controllers is taken and an output thereof is "1". The next scanning is started with inputting the output of the logical sum to the scan control unit 170 as a trigger. That is, the scan control unit 170 is instructed to start scanning based on the transmission completion of the memory controllers corresponding to the plurality of detectors.

Figure 6A:
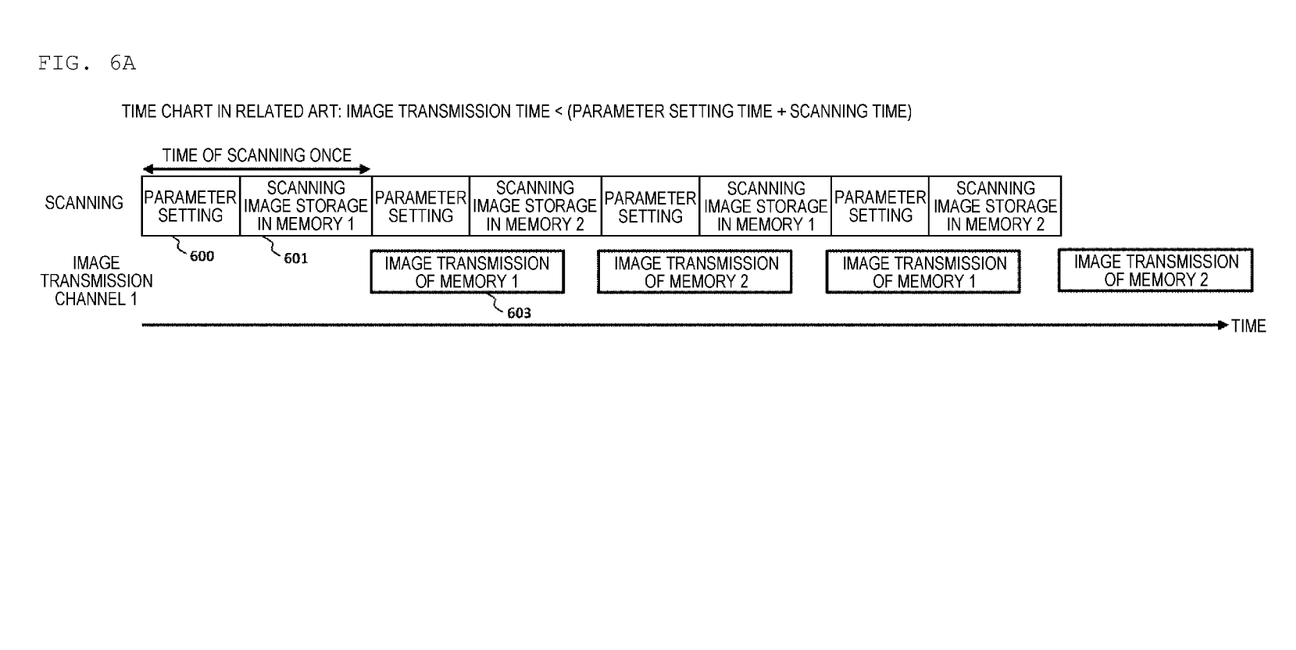
FIG. 6A is a diagram showing an example of a time chart of scanning and image transmission in the related art.
Figure 6B:
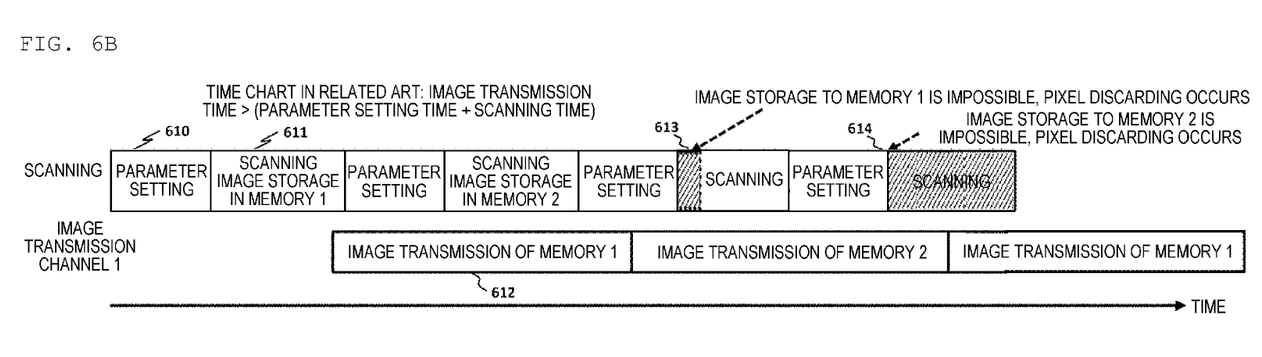
FIG. 6B is a diagram showing another example of the time chart of the scanning and image transmission in the related art.

FIGS. 6A and 6B show examples of time charts of scanning and image transmission in a configuration in the related art. For simplicity, image transmission of only one channel is shown. FIG. 6A is an example in which an image transmission time 603 (a parameter setting time 600+a scanning time 601), and in this case, scanning and image transmission is performed in parallel without any problem. FIG. 6B is an example in which an image transmission time 612>(a parameter setting time 610+a scanning time 611). In the configuration in the related art, the scanned image is stored in a memory different from the memory for transmission, but since the transmission time increases due to waiting for CPU processing or the like, the read memory is in use and pixels that cannot be stored in the memory (hatched portions 613 and 614 in FIG. 6B) may exist. As a result, there is a problem that evaluation of all images is impossible. In the examples, a case where there are two memories is illustrated, but the same problem also exists in a case of a plurality of memories.

Figure 7:
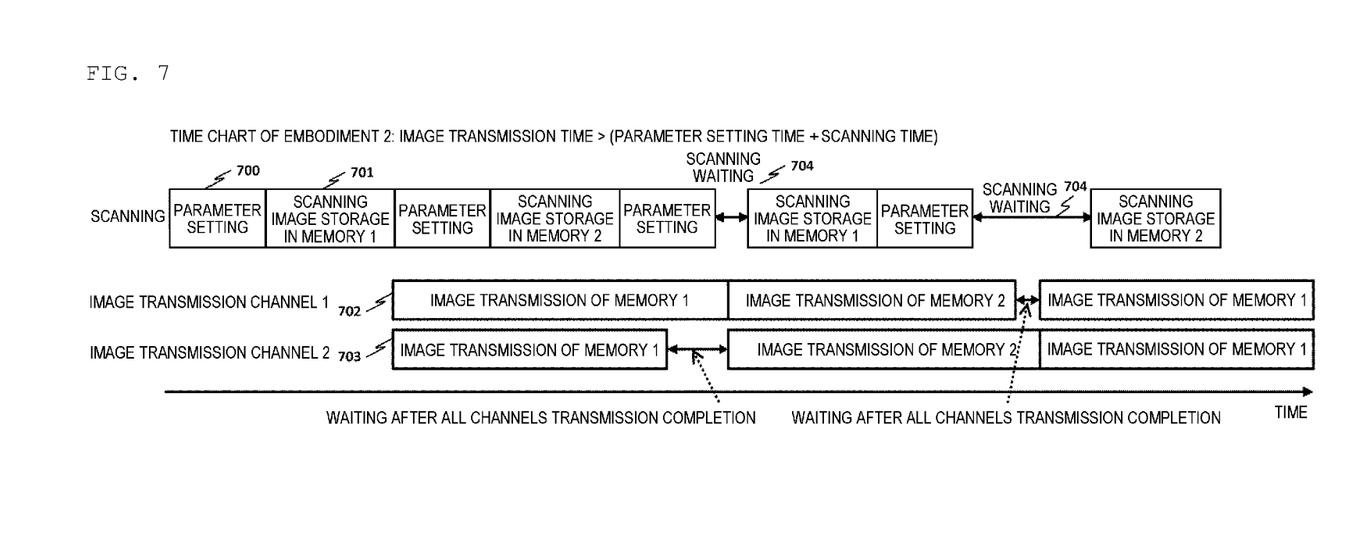
FIG. 7 is a diagram showing an example of a time chart of scanning and image transmission of Embodiment 2.

FIG. 7 is a time chart of scanning and image transmission according to the present embodiment under the same conditions as in FIG. 6B. Examples of image transmission times 702 and 703 of a channel 1 and a channel 2 after a parameter setting time 700 and a scanning time 701 are shown, but scanning is performed after scanning waiting 704 until the image transmission of all channels is completed; therefore, it can be seen that scanning and image transmission can be performed in parallel without discarding pixels. According to the present embodiment, scanning and image transmission can be performed in parallel while preventing pixel discard with a simple configuration. That is, the parameter adjustment time can be shortened while ensuring image evaluation and evaluation for all parameters.

In addition, in the present embodiment, a configuration of two memories is used and the memories is switched, but an area capable of storing two images may be secured in one memory, and an address for writing an image and an address for reading the image may be switched.

Embodiment 3

In Embodiment 2, a pixel discard prevention method with a configuration of two memories is shown. In the present embodiment, a method in which the overall throughput can be improved by using three or more memories and extending a period until the scanning waiting occurs is shown.

Figure 8:
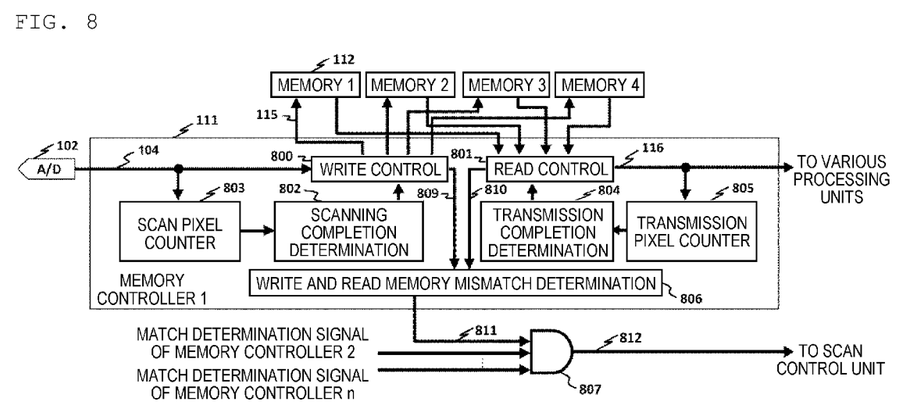
FIG. 8 is a detailed configuration diagram of a memory controller of Embodiment 3.

FIG. 8 shows a configuration of the memory controller 111 that prevents pixel discard in four memories 112. As a configuration different from that in FIG. 4, a write and read memory mismatch determination 806 is provided, in which write memory information 809 and read memory information 810 is read from a write control 800 and a read control 801 respectively, and "1" is output if the write memory and the read memory do not match as a mismatch determination signal 811 and "0" is output if the write memory and the read memory match. According to an output signal of a logical sum 807 of mismatch determination signals 812 of all channels, a function is provided that the next scanning is immediately started when the memory in use does not match with all the channels, and the scanning waits when the memory in use matches a certain one of the channels. That is, the memory controller executes mismatch determination for determining whether a memory that stores an image and a memory that reads the image do not match, and, instructs the scan control unit 170 to start scanning based on the mismatch determination of the memory controller corresponding to a plurality of detectors. In addition, an example of memory switching in the present embodiment is a method of switching on a ring buffer such as a memory 1, a memory 2, a memory 3, a memory 4, and a memory 1, . . . .

Figure 9:
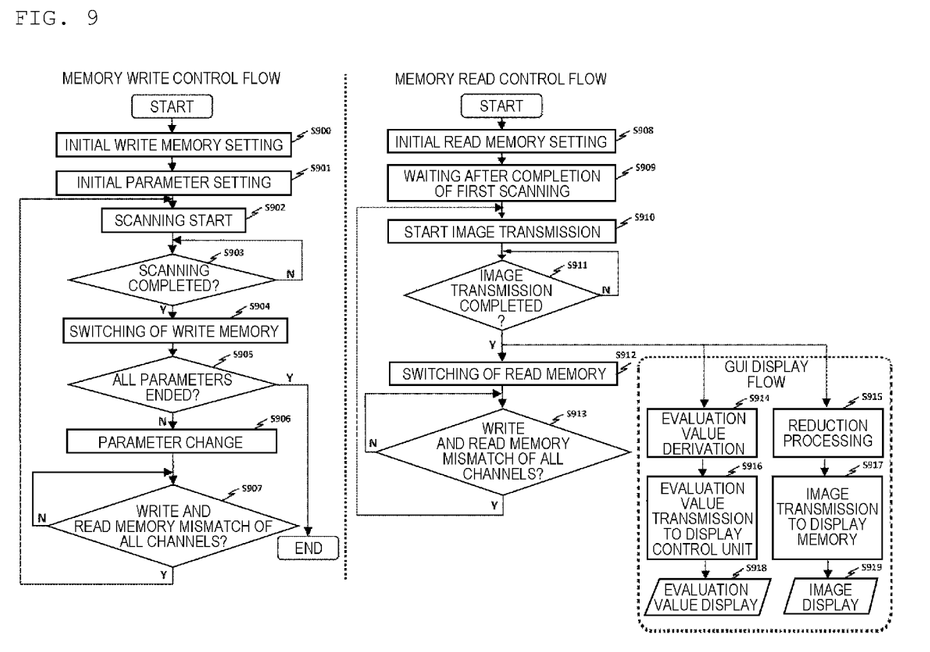
FIG. 9 is a diagram showing an operation flow of the memory controller of Embodiment 3 at the time of parameter automatic adjustment.

FIG. 9 is a flowchart of the present embodiment. Details are omitted because there are steps common to Embodiment 2, but (step S907) and (step S913) as new steps are described. The write memory is switched when the scanning is completed, and the read memory is switched when the transmission is completed; therefore, in (step S907), a match determination of the memories is performed on all channels, and when it is determined match occurs even in one channel, the scanning waiting is performed, so that scanning and image transmission can be performed without discarding pixels. In addition, in (step S913), by performing the match determination of the memories for each channel, image transmission can be immediately started in the case of mismatch. Here, (step S910) to (step S919) are performed in parallel for the number of channels.

Figure 10:
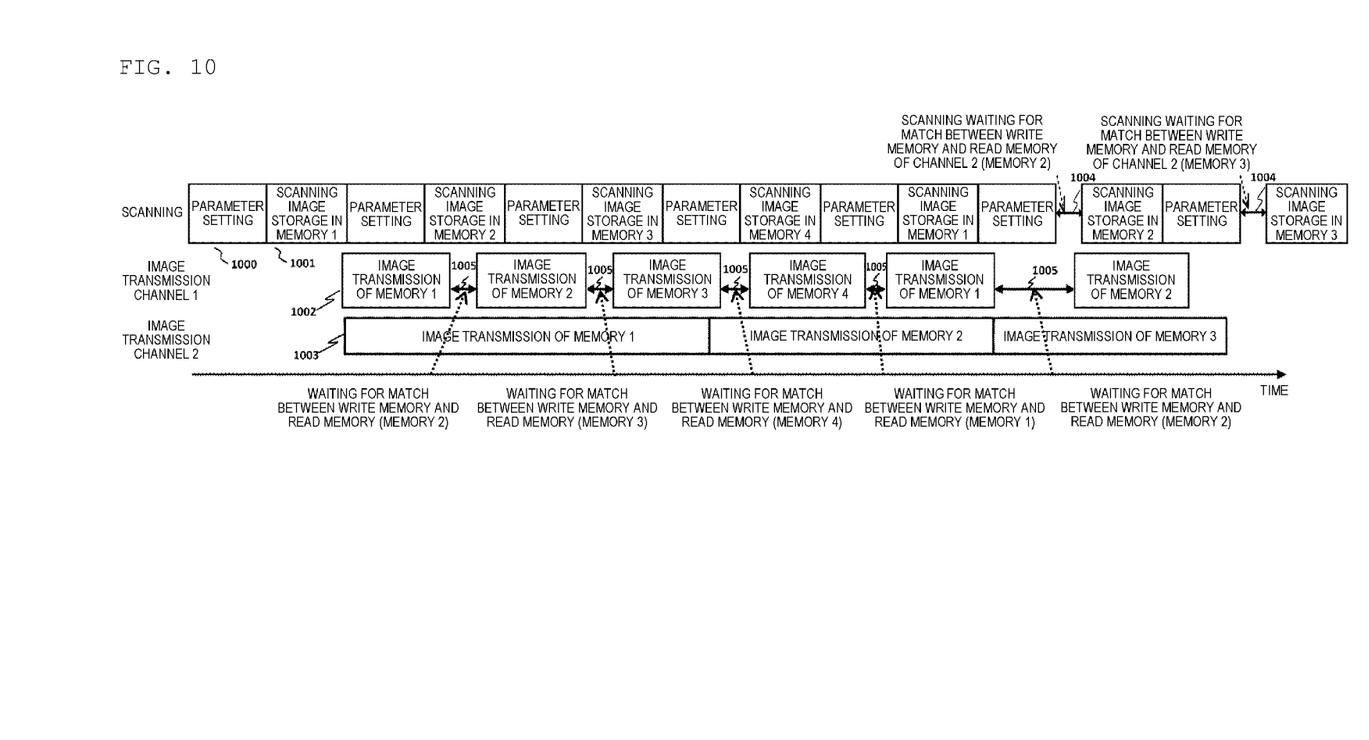
FIG. 10 is a diagram showing an example of a time chart of scanning and image transmission of Embodiment 3.

FIG. 10 is a time chart of scanning and image transmission in the present embodiment. In the channel 2, a case where an image transmission period 1003 is a long period is taken as an example. As shown in FIG. 10, since scanning waiting 1004 can be performed only when pixel discard occurs, the overall throughput can be improved as compared with Embodiment 2. In addition, transmission waiting 1005 is a period of waiting until the image can be transmitted for each channel, and the present embodiment adopts a configuration in which a transmittable image is transmitted at any time, but a configuration can also be adopted in which the image transmission is performed by waiting for the completion of the image transmission of all channels for the purpose of synchronizing the image transmission of all channels.

Embodiment 4

Figure 11:
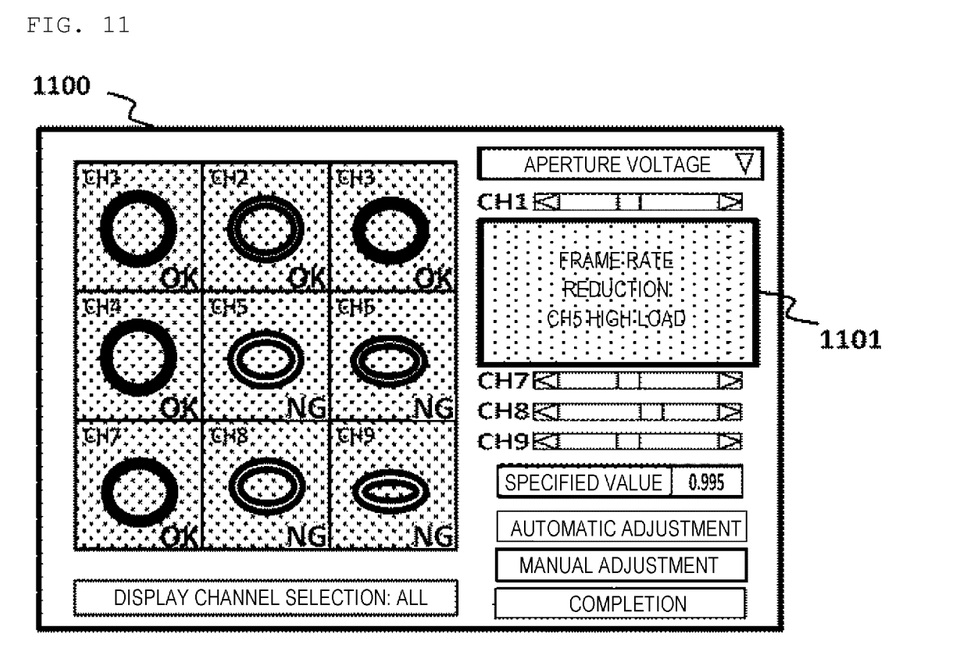
FIG. 11 is a diagram showing an example of GUI screen display of Embodiment 4.

Embodiment 2 and Embodiment 3 are embodiments for preventing pixel discard by the scanning waiting, and there is a dead time between scanning. That is, it means that a frame rate is lower than a maximum frame rate (the number of scan frames per unit time) when scanning is performed without dead time. FIG. 11 is a GUI configuration 1100 showing that the frame rate is reduced to a user. By displaying frame rate reduction information when scanning waiting occurs and also displaying which channel has a long transmission time (1101), it is possible to understood whether the condition setting (image size to be scanned, or the like) for parameter adjustment is appropriate and a channel that is a bottleneck, and the usability can be improved. The display control unit 140 controls to perform such display 1101 based on the condition of the image stored in the display image memory 150. That is, the display control unit 140 controls the GUI 130 to display the frame rate reduction information when a scan stop period occurs between scanning for each frame.

In addition, the present invention is not limited to the above embodiments, and includes various modifications. For example, the above embodiments are described in detail for facilitating understanding of the present invention, and are not necessarily limited to those including all the described configurations. In addition, a part of a configuration of a certain embodiment can be replaced with a configuration of another embodiment, or the configuration of the other embodiment can be added to the configuration of the certain embodiment. In addition, a part of the configuration of each embodiment may be added to, deleted from, or replaced with another configuration.

In addition, a part or all of the above configurations, functions, processing units, processing methods and the like may be implemented by hardware such as through design using an integrated circuit. Each of the above configurations, the functions and the like may be implemented by software by interpreting and executing a program that implements respective functions by a processor. Information such as a program, a table, and a file for implementing each of the functions can be stored in a recording device such as a memory, a hard disk, or a solid state drive (SSD), or in a recording medium such as an IC card, an SD card, or a DVD. Control lines or information lines are shown as those considered necessary for description, and not all the control lines or information lines are necessarily shown in a product. In practice, it may be considered that almost all configurations are connected to each other.

REFERENCE SIGN LIST 100 pixel acquisition device
101 detector
102 A/D converter
103 analog signal
104 digital pixel value
110 arithmetic device
111 controller
112 memory
113 evaluation value derivation unit
114 image reduction unit
115, 116 image information
117 evaluation value
118 reduced image information
120 overall control unit
130 GUI
200 GUI screen
201 image display unit
202 display selection input unit
203 parameter selection button
204 slider input unit
205 specified value input unit
206 automatic adjustment button
207 manual adjustment button
208 completion button
140 display control unit
150 display image memory
160 optical parameter setting unit
161 optical parameter information
170 scan control unit
171 scan information
400 write control
401 read control
402 scanning completion determination
403 scan pixel counter
404 transmission completion determination
405 transmission pixel counter

The invention claimed is:

1. A charged particle beam device, comprising:
an optical system configured to irradiate a sample with a plurality of primary charged particle beams;
an optical parameter setting unit configured to set a parameter of the optical system;
a detector configured to individually detect a plurality of secondary charged particle beams emitted from the sample;
a plurality of storage units each configured to store a signal, that is detected by the detector and converted into a digital pixel, in a form of a detected image;
an evaluation value derivation unit configured to derive an evaluation value of the primary charged particle beam from the detected image; and
a GUI configured to display an image and receive an input from a user;
an image reduction unit configured to reduce the detected image;
a display image memory configured to store the image reduced by the image reduction unit; and
a display control unit configured to simultaneously display, on a screen of the GUI, a plurality of reduced images stored in the display image memory and evaluation results based on the evaluation values adjacently.

2. The charged particle beam device according to claim 1, further comprising:
a scan control unit configured to generate a scan signal of the primary charged particle beam; and
an overall control unit configured to set information input from the GUI into the optical parameter setting unit and set scan information into the scan control unit.

3. The charged particle beam device according to claim 2, wherein
the GUI includes a display selection input unit through which the image to be displayed is selected, and an image display unit on which a predetermined number of images selected by a user and corresponding evaluation results are displayed adjacently.

4. The charged particle beam device according to claim 3, wherein
the GUI further includes a parameter selection unit through which the parameter is selected, a slider input unit through which the parameter is able to be changed in real time, and a specified value input unit through which a specified value of the evaluation value is input.

5. The charged particle beam device according to claim 4, wherein
the GUI further includes a manual adjustment button and an automatic adjustment button through which a manual adjustment or an automatic adjustment is selected by a user.

6. The charged particle beam device according to claim 1, wherein
the display control unit controls the GUI to display frame rate reduction information when a scan stop period occurs between scanning for each frame.

7. A charged particle beam device comprising:
an optical system configured to irradiate a sample with a plurality of primary charged particle beams;
an optical parameter setting unit configured to set a parameter of the optical system;
a detector configured to individually detect a plurality of secondary charged particle beams emitted from the sample;
a plurality of storage units each configured to store a signal, that is detected by the detector and converted into a digital pixel, in a form of a detected image;
an evaluation value derivation unit configured to derive an evaluation value of the primary charged particle beam from the detected image;
a GUI configured to receive an input from a user;
an image reduction unit configured to reduce the detected image;
a display image memory configured to store the image reduced by the image reduction unit;
a display control unit configured to display, on a screen of the GUI, the image stored in the display image memory and the evaluation result based on the evaluation value;
a scan control unit configured to generate a scan signal of the primary charged Particle beam; and a controller configured to control write and read of an image of the storage unit, wherein the controller includes a scan pixel counter configured to count the digital pixel and a transmission pixel counter configured to count the number of transmission pixels during image transmission, performs a write control so as to switch the storage unit configured to store the image when scanning completion is determined based on the number of scan pixels output from the scan pixel counter and a preset image size, and performs a read control so as to switch the storage unit configured to read the image when transmission completion is determined based on the number of transmission pixels output from the transmission pixel counter and a preset image size.

8. The charged particle beam device according to claim 7, wherein the scan control unit is instructed to start scanning based on the transmission completion of the controller corresponding to a plurality of the detectors.

9. The charged particle beam device according to claim 7, wherein the controller executes a mismatch determination for determining whether the storage unit configured to store an image and the storage unit configured to read the image do not match, and instructs the scan control unit to start scanning, based on the mismatch determination of the controller corresponding to a plurality of the detectors.

10. An operation method for a charged particle beam device, the charged particle beam device including a GUI configured to display an image and receive an input from a user, the operation method comprising:

setting a parameter for an optical system configured to irradiate a sample with a plurality of primary charged particle beams;

individually detecting a plurality of secondary charged particle beams emitted from the sample;

converting a detected signal into a digital pixel and storing the digital pixel as an image;

deriving an evaluation value of the primary charged particle beam from the image; and reducing a plurality of the detected images and simultaneously displaying, on a screen of the GUI, the reduced images and evaluation results based on the evaluation values adjacently.

11. The operation method for the charged particle beam device according to claim 10, wherein the GUI displays a predetermined number of images selected by a user and corresponding evaluation results adjacently.

12. The operation method for the charged particle beam device according to claim 11, wherein the GUI is capable of changing the parameter in real time by selecting the parameter.

13. The operation method for the charged particle beam device according to claim 12, wherein on the GUI, a user is able to select a manual adjustment or an automatic adjustment of the parameter.

* * * * *